United States Patent
Dai et al.

(10) Patent No.: US 12,405,315 B1
(45) Date of Patent: Sep. 2, 2025

(54) FUEL CELL AGING PREDICTION METHOD, SYSTEM THEREOF, MEDIUM AND PRODUCT

(71) Applicant: Tongji University, Shanghai (CN)

(72) Inventors: Haifeng Dai, Shanghai (CN); Hao Yuan, Shanghai (CN); Zhaoming Liu, Shanghai (CN); Wei Tang, Shanghai (CN); Xuezhe Wei, Shanghai (CN)

(73) Assignee: Tongji University, Shanghai (CN)

( * ) Notice: Subject to any disclaimer, the term of this patent is extended or adjusted under 35 U.S.C. 154(b) by 0 days.

(21) Appl. No.: 18/905,876

(22) Filed: Oct. 3, 2024

(30) Foreign Application Priority Data

Jul. 1, 2024 (CN) .......................... 202410864621.8

(51) Int. Cl.
| | |
|---|---|
| G06F 11/30 | (2006.01) |
| G01R 31/36 | (2020.01) |
| G01R 31/367 | (2019.01) |
| G01R 31/3842 | (2019.01) |
| G01R 31/392 | (2019.01) |
| G01R 31/396 | (2019.01) |

(52) U.S. Cl.
CPC ....... *G01R 31/392* (2019.01); *G01R 31/3648* (2013.01); *G01R 31/367* (2019.01); *G01R 31/3842* (2019.01); *G01R 31/396* (2019.01)

(58) Field of Classification Search
CPC .................................................. G01R 31/392
See application file for complete search history.

(56) References Cited

U.S. PATENT DOCUMENTS

2024/0054269 A1 * 2/2024 Lyu ........................ H02J 7/0047

FOREIGN PATENT DOCUMENTS

| CN | 113406505 A | * | 9/2021 | ........... G01R 31/367 |
| CN | 114373965 A | * | 4/2022 | |
| CN | 114814589 A | * | 7/2022 | ........... G01R 31/367 |

OTHER PUBLICATIONS

Office Action as received in CN Application 202410864621.8 mailed Aug. 1, 2024.

* cited by examiner

*Primary Examiner* — Phuong Huynh
(74) *Attorney, Agent, or Firm* — Keller Preece PLLC

(57) ABSTRACT

Provided is a fuel cell aging prediction method, a system thereof and a medium. The method includes the following steps: acquiring operation parameters and calculation parameters of a fuel cell corresponding to each historical moment in a historical time period, where the calculation parameters include a stack voltage, active area and a hydrogen permeation current; carrying out calculation based on the calculation parameters corresponding to the historical moment to obtain a mixed aging index corresponding to the historical moment; taking the operation parameters and the mixed aging index corresponding to each historical moment in the historical time period as inputs, and predicting the mixed aging index corresponding to the prediction moment by a mixed aging index prediction model.

9 Claims, 4 Drawing Sheets

Acquiring operation parameters and calculation parameters of a fuel cell corresponding to each historical moment in a historical time period, wherein the operation parameters include a current, an anode pressure, a cathode pressure, a cooling liquid temperature at an inlet of a stack and an air flow rate; the calculation parameters include a stack voltage, active area and a hydrogen permeation current

S1

For each historical moment in the historical time period, carrying out calculation based on the calculation parameters corresponding to the historical moment to obtain a mixed aging index corresponding to the historical moment

S2

Taking the operation parameters and the mixed aging index corresponding to each historical moment in the historical time period as inputs, and predicting the mixed aging index corresponding to the prediction moment by a mixed aging index prediction model

S3

```
┌─────────────────────────────────────────────────────────┐
│ Acquiring operation parameters and calculation          │
│ parameters of a fuel cell corresponding to each         │
│ historical moment in a historical time period, wherein  │
│ the operation parameters include a current, an anode    │
│ pressure, a cathode pressure, a cooling liquid          │
│ temperature at an inlet of a stack and an air flow      │
│ rate; the calculation parameters include a stack        │
│ voltage, active area and a hydrogen permeation current  │
└─────────────────────────────────────────────────────────┘
                             │
                             ▼  S1
┌─────────────────────────────────────────────────────────┐
│ For each historical moment in the historical time       │
│ period, carrying out calculation based on the           │
│ calculation parameters corresponding to the historical  │
│ moment to obtain a mixed aging index corresponding to   │
│ the historical moment                                   │
└─────────────────────────────────────────────────────────┘
                             │
                             ▼  S2
┌─────────────────────────────────────────────────────────┐
│ Taking the operation parameters and the mixed aging     │
│ index corresponding to each historical moment in the    │
│ historical time period as inputs, and predicting the    │
│ mixed aging index corresponding to the prediction       │
│ moment by a mixed aging index prediction model          │
└─────────────────────────────────────────────────────────┘
                                                      S3
```

FIG. 1

FUEL CELL AGING PREDICTION METHOD, SYSTEM THEREOF, MEDIUM AND PRODUCT

CROSS-REFERENCE TO RELATED APPLICATION

This patent application claims the benefit and priority of Chinese Patent Application No. 2024108646218 filed with the China National Intellectual Property Administration on Jul. 1, 2024, the disclosure of which is incorporated by reference herein in its entirety as part of the present application.

TECHNICAL FIELD

The present disclosure relates to the technical field of fuel cell aging prediction, in particular to a fuel cell aging prediction method, a system thereof and a medium based on the fusion of a stack voltage, active area and a hydrogen permeation current.

BACKGROUND

A proton exchange membrane fuel cell vehicle has the advantages of zero emission, fast hydrogenation and a long driving range, and thus is considered as one of the leading technologies of the next generation of new energy vehicles. However, the life of a fuel cell is still one of the main limitations for the large-scale commercial application of fuel cell vehicles. During the aging (or attenuation) of fuel cells, the attenuation of catalyst, such as a particle glomeration and falling off and carbon layer corrosion, will result in the decrease of the catalyst reactive area. The attenuation of sulfonate groups, side chains and main chains of proton exchange membranes will result in the increase of hydrogen permeability of proton exchange membranes. Therefore, it is necessary to predict the aging trend of fuel cells in time, and then adjust the reaction conditions of the fuel cells or maintain the fuel cells in time to improve their service life.

It is of great importance to select an appropriate fuel cell aging index for predicting the aging degree of fuel cells. At present, the voltage index is mainly used as the fuel cell aging index. For example, taking the stack voltage as the aging index, a differential autoregressive moving average model is used to predict the stack voltage; and taking the stack voltage as the aging index, the bidirectional long short-term memory network is used to predict the stack voltage. Although the stack voltage is the most direct index to characterize the output performance of fuel cells, there are many factors affecting the stack voltage, which cannot directly reflect the attenuation degree of internal materials of fuel cells. For this reason, some technologies consider other indexes that can characterize the attenuation degree of internal materials of fuel cells as the aging index. For example, taking the active area of the stack as the aging index, the aging prediction is made by an empirical model. However, it is still impossible to describe the attenuation degree of the external characteristics and the internal materials of the fuel cell comprehensively and accurately by using a single active area of the stack as an aging index. Therefore, it is necessary to establish a comprehensive aging index which can describe the attenuation degree of the external characteristics and the internal materials of the fuel cell accurately, thereby improving the prediction effect of the aging degree of the fuel cell.

SUMMARY

The present disclosure aims to provide a fuel cell aging prediction method, a system thereof, a medium and a product, which integrates the stack voltage, the active area and the hydrogen permeation current to establish a mixed aging index which can describe the external characteristic attenuation and the internal material attenuation of the fuel cell more comprehensively and accurately, thereby improving the prediction effect of the aging degree of the fuel cell.

In order to achieve the above effects, the present disclosure provides the following solutions.

A fuel cell aging prediction method is provided, including:

acquiring operation parameters and calculation parameters of a fuel cell corresponding to each historical moment in a historical time period, where the operation parameters include a current, an anode pressure, a cathode pressure, a cooling liquid temperature at an inlet of a stack and an air flow rate; and the calculation parameters include a stack voltage, active area and a hydrogen permeation current;

for each historical moment in the historical time period, carrying out calculation based on the calculation parameters corresponding to the historical moment to obtain a mixed aging index corresponding to the historical moment; and taking the operation parameters and the mixed aging index corresponding to each historical moment in the historical time period as inputs, and predicting the mixed aging index corresponding to a prediction moment by a mixed aging index prediction model.

In some embodiments, a calculation expression of the mixed aging index is:

$$\phi = a\frac{V}{V_0} + b\frac{S_{ECA}}{S_{ECA0}} + c\frac{I_{S0}}{I_s};$$

where φ is the mixed aging index; a is a weight factor of the voltage; V is the stack voltage in unit of V; $V_0$ is a standard value of the stack voltage in unit of V; b is a weight factor of the active area; $S_{ECA}$ is the active area in unit of m²/g; $S_{ECA0}$ is a standard value of the active area in unit of m²/g; c is a weight factor of the hydrogen permeation current; Iso is a standard value of the hydrogen permeation current in unit of mA/cm²; $I_s$ is the hydrogen permeation current in unit of mA/cm².

In some embodiments, prior to taking the operation parameters and the mixed aging index corresponding to each historical moment in the historical time period as inputs, and predicting the mixed aging index corresponding to the prediction moment by the mixed aging index prediction model, the method further includes:

acquiring a training data set; where the training data set includes a plurality of samples and a label corresponding to each sample; the samples include operation parameters and the mixed aging index of the fuel cell corresponding to each sample historical moment in a sample historical time period; the label includes a mixed aging index corresponding to a sample prediction moment;

establishing an initial prediction model; where the initial prediction model is a depth residual network based on a Spatial and Channel Squeeze & Excitation (scSE) attention mechanism; and training the initial prediction model by the training data set to obtain a mixed aging index prediction model.

In some embodiments, acquiring a training data set specifically includes:

carrying out a durability test on the stack of the fuel cell to obtain a tested fuel cell;

acquiring the operation parameters and the stack voltage obtained by measuring the tested fuel cell; acquiring the active area obtained by measuring the stack of the tested fuel cell by a cyclic voltammetry; acquiring the hydrogen permeation current obtained by measuring the stack of the tested fuel cell by a linear sweep voltammetry; carrying out calculation based on the stack voltage, the active area and the hydrogen permeation current to obtain the mixed aging index, where the operation parameters and the mixed aging index form a set of measurement data;

determining whether the number of sets of the measurement data reaches a preset value; in response to the number of sets of the measurement data not reaching the preset value, continuing iteration with taking the tested fuel cell as the fuel cell in the next cycle, and returning to a step of carrying out the durability test on the stack of the fuel cell; in response to the number of sets of the measurement data reaching the preset value, ending iteration, and sorting all the measurement data according to a sequence of acquisition time to obtain a measurement data set; and processing the measurement data set by a sliding window method to obtain a training data set.

In some embodiments, stack voltage time series data, active area time series data and hydrogen permeation current time series data are analyzed by a factor analysis method or an information weight method to obtain the weight factor of the voltage, the weight factor of the active area and the weight factor of the hydrogen permeation current; the stack voltage time series data is time series data obtained by sorting the stack voltages in the measurement data set according to the sequence of acquisition time; the active area time series data is time series data obtained by sorting the active areas in the measurement data set according to the sequence of acquisition time; the hydrogen permeation current time series data is time series data obtained by sorting the hydrogen permeation currents in the measurement data set according to sequence of acquisition time.

A fuel cell aging prediction system is provided, including: a sensor measuring device, an active area and hydrogen permeation current measuring device and a processor; where:

the sensor measuring device is configured to measure operation parameters and stack voltages of a fuel cell; wherein the operation parameters include a current, an anode pressure, a cathode pressure, a cooling liquid temperature at an inlet of a stack and an air flow rate;

the active area and hydrogen permeation current measuring device is configured to measure the active area and the hydrogen permeation current of the fuel cell; and the processor is in communication with the sensor measuring device and the active area and hydrogen permeation current measuring device, respectively; and the processor is configured to execute the fuel cell aging prediction method described above.

In some embodiments, the active area and hydrogen permeation current measuring device includes a gas supply part, a charging part and a data acquisition and calculation unit; where:

the gas supply part is connected with a stack pipeline of the fuel cell and configured to supply nitrogen to a cathode pipeline of the fuel cell;

the charging part is electrically connected with the stack of the fuel cell and configured to charge the stack of the fuel cell; and the data acquisition and calculation unit is connected with the gas supply part and the charging part in a control manner, respectively, and configured to control the gas supply part to start working, control a charging process of the charging part to the stack of the fuel cell based on a cyclic voltammetry, acquire a first voltammetry characteristic curve in the charging process, calculate the active area based on the first voltammetry characteristic curve, control the charging process of the charging part to the stack of the fuel cell based on a linear sweep voltammetry, acquire a second voltammetry characteristic curve in the charging process, and calculate a hydrogen permeation current based on the second voltammetry characteristic curve.

In some embodiments, the active area and hydrogen permeation current measuring device further includes: a discharging part and a suction part; where:

the discharging part is electrically connected with the stack of the fuel cell and configured to discharge the stack of the fuel cell to consume oxygen in the cathode pipeline of the fuel cell, so that only nitrogen exists in the cathode pipeline;

the suction part is connected with the cathode pipeline and a gas supply part pipeline, respectively, and configured to suck nitrogen in the cathode pipeline and store the nitrogen in the gas supply part; and the data acquisition and calculation unit is connected with the discharging part and the suction part in a control manner, respectively, and configured to control the discharging part and the suction part to start working.

Provided is a non-transitory computer-readable storage medium having a computer program stored thereon, wherein the computer program, when executed by a processor, implements the fuel cell aging prediction method described above.

Provided is a computer program product, including a computer program, wherein the computer program, when executed by a processor, implements the fuel cell aging prediction method described above.

According to the specific embodiment provided by the present disclosure, the present disclosure discloses the following technical effects.

The present disclosure provides a fuel cell aging prediction method, a system thereof, a medium and a product. The method includes the following steps: acquiring operation parameters and calculation parameters of a fuel cell corresponding to each historical moment in a historical time period, where the calculation parameters include a stack voltage, active area and a hydrogen permeation current; carrying out calculation based on the calculation parameters corresponding to the historical moment to obtain a mixed aging index corresponding to the historical moment; taking the operation parameters and the mixed aging index corresponding to each historical moment in the historical time period as inputs, and predicting the mixed aging index corresponding to the prediction moment by a mixed aging index prediction model. The method integrates the stack voltage, the active area and the hydrogen permeation current to establish a mixed aging index which can describe the external characteristic attenuation and the internal material attenuation of the fuel cell more comprehensively and accurately, thereby improving the prediction effect of the aging degree of the fuel cell.

BRIEF DESCRIPTION OF THE DRAWINGS

In order to explain the embodiments of the present disclosure or the technical solution in the prior art more clearly, the drawings used in the embodiments will be briefly described hereinafter. Obviously, the drawings in the following description are only some embodiments of the present disclosure. For those skilled in the art, other drawings can be obtained according to these drawings without creative labor.

FIG. 1 is a schematic flow diagram of a fuel cell aging prediction method according to Embodiment 1 of the present disclosure;

DESCRIPTION OF REFERENCE NUMERALS

1—hydrogen inlet solenoid valve; 2—first proportional valve; 3—hydrogen circulation device; 4—first gas—water separator; 5—hydrogen discharging valve; 6—mass flowmeter; 7—air compressor; 8—intercooler; 9—humidifier; 10—front throttle; 11—back pressure valve; 12—nitrogen storage tank; 13—second proportional valve; 14—bubble humidifier; 15—power converter; 16—power battery; 17—data acquisition and calculation unit; 18—discharge relay; 19—discharge resistor; 20—bypass throttle; 21—second gas—water separator; 22—blower; and 23—pressure sensor.

DETAILED DESCRIPTION OF THE EMBODIMENTS

The technical solutions in the embodiments of the present disclosure will be clearly and completely described with reference to the drawings in the embodiments of the present disclosure hereinafter. Obviously, the described embodiments are only some embodiments of the present disclosure, rather than all of the embodiments. Based on the embodiment of the present disclosure, all other embodiments obtained by those skilled in the art without creative labor fall within the scope of protection of the present disclosure.

The present disclosure aims to provide a fuel cell aging prediction method, a system thereof, a medium and a product, which integrates the stack voltage, the active area and the hydrogen permeation current to establish a mixed aging index which can describe the external characteristic attenuation and the internal material attenuation of the fuel cell more comprehensively and accurately, thereby improving the prediction effect of the aging degree of the fuel cell.

In order to make the above objects, features and advantages of the present disclosure more obvious and understandable, the present disclosure will be described in further detail with reference to the drawings and detailed description hereinafter.

Embodiment 1

Figure 2:
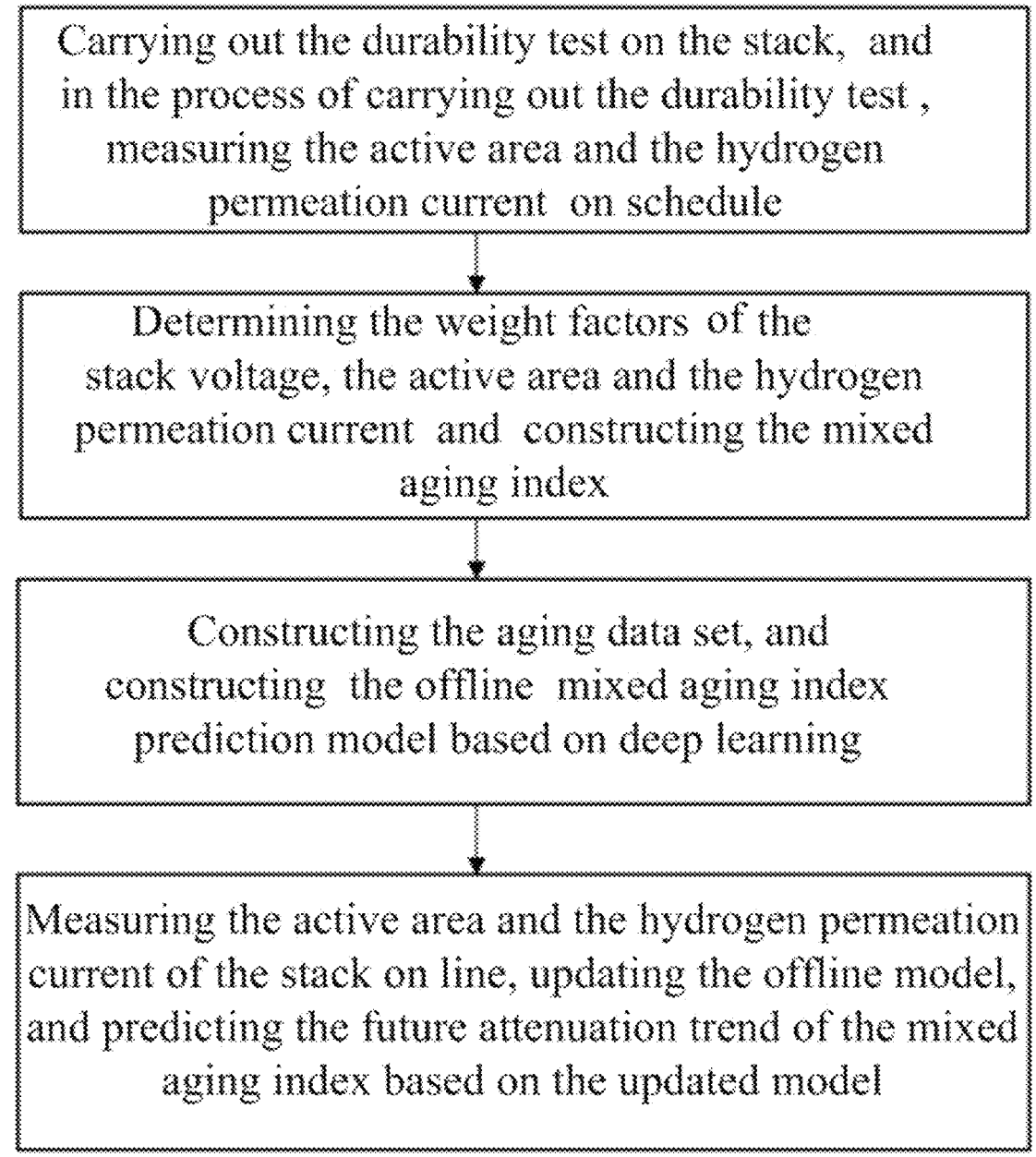
FIG. 2 is a detail schematic flow diagram of the fuel cell aging prediction method according to Embodiment 1 of the present disclosure.

As shown in FIGS. 1 and 2, a fuel cell aging prediction method in this embodiment includes the following steps:

S1: acquiring operation parameters and calculation parameters of a fuel cell corresponding to each historical moment in a historical time period, where the operation parameters include a current, an anode pressure, a cathode pressure, a cooling liquid temperature at an inlet of a stack and an air flow rate; the calculation parameters include a stack voltage, active area and a hydrogen permeation current;

S2: for each historical moment in the historical time period, carrying out calculation based on the calculation parameters corresponding to the historical moment to obtain a mixed aging index corresponding to the historical moment; and S3: taking the operation parameters and the mixed aging index corresponding to each historical moment in the historical time period as inputs, and predicting the mixed aging index corresponding to the prediction moment by a mixed aging index prediction model.

Aiming at the problem that the aging index currently used is single, this embodiment integrates the active area and the hydrogen permeation current on the basis of the traditional aging index of the stack voltage to establish a mixed aging index which can describe the external characteristic attenuation and the internal material attenuation of the fuel cell more comprehensively and accurately.

When establishing the mixed aging index of the fuel cell, considering that the stack voltage and the active area decrease with the increase of the aging degree at a fixed current density, and the hydrogen permeation current increases with the increase of the aging degree, the calculation expression of the mixed aging index constructed in this embodiment is as follows:

$$\phi = a\frac{V}{V_0} + b\frac{S_{ECA}}{S_{ECA0}} + c\frac{I_{s0}}{I_s}; \quad (1)$$

In Formula (1), φ is a mixed aging index, that is, an aging index that can represent the service life of the stack; a is a weight factor of the voltage; V is a stack voltage in unit of V, which is the stack voltage at the selected current density, where the current density can be selected according to the actual application, for example, the current density at a rated power can be selected; $V_0$ is a standard value of the stack voltage in unit of V; b is a weight factor of the active area; $S_{ECA}$ is active area in unit of m²/g, which refers to the active surface area on the electrode surface that can participate in electrochemical reaction; $S_{ECA0}$ is a standard value of the active area in unit of m²/g; c is a weight factor of the hydrogen permeation current; $I_{s0}$ is a standard value of the hydrogen permeation current in unit of mA/cm²; $I_s$ is a hydrogen permeation current in unit of mA/cm².

In Formula (1), the method of acquiring the standard value of the stack voltage, the standard value of the active area and the standard value of the hydrogen permeation current is as follows: based on the designed sensor measuring device, the active area and the hydrogen permeation current measuring device, testing the fresh fuel cell that has not been put into use to acquire an initial stack voltage, an initial active area and an initial hydrogen permeation current. For example, the initial stack voltage is 0.68V (at a current density of 1.5A/cm$^2$), the initial active area is 85 m$^2$/g, and the initial hydrogen permeation current is 1.3 mA/cm$^2$. The initial stack voltage is taken as the standard value of the stack voltage, the initial active area is taken as the standard value of the active area, and the initial hydrogen permeation current is taken as the standard value of the hydrogen permeation current.

In this embodiment, the mixed aging index constructed based on Formula (1) includes not only the most direct stack voltage information, but also the active area that can characterize the attenuation degree of the catalytic layer and the hydrogen permeation current that can characterize the attenuation degree of the exchange membrane, so as to realize a more meaningful aging evaluation that can represent the attenuation degree of critical materials in the fuel cell better.

Prior to S3, the fuel cell aging prediction method of this embodiment further includes: training the mixed aging index prediction model, which specifically includes the following steps.

(1) a training data set is acquired, where the training data set includes multiple samples and a label corresponding to each sample; the samples include operation parameters and mixed aging indexes of the fuel cell corresponding to each sample historical moment in a sample historical time period; the label includes a mixed aging index corresponding to a sample prediction moment.

Acquiring a training data set specifically includes the following steps.

(1.1) a durability test is carried out on the stack of the fuel cell to obtain the tested fuel cell.

Based on the durability test conditions, the durability test has been carried out on the stack of the fuel cell for a specific duration to complete the durability test, and then the fuel cell at this time is referred to as the tested fuel cell. The durability test conditions are determined according to the actual loading operating conditions of the fuel cell system. The shorter the specific duration the higher the aging prediction resolution. However, if the specific duration is set too short, the overall cost of the durability test is too high, and thus the specific duration can be selected according to the actual situation. As an example, the specific duration can be 1 hour.

In the process of carrying out the durability test, the measurement process in (1.2) shall be performed once after every test of the durability operating condition for the specific duration. When the specific duration is 1 hour, after every durability test for 1 hour, the sensor measurement, the cyclic voltammetry measurement and the linear sweep voltammetry measurement shall be carried out to obtain a set of measurement data.

(1.2) the operation parameters and the stack voltage obtained by measuring the tested fuel cell are acquired; where the operation parameters include a current, an anode pressure, a cathode pressure, a cooling liquid temperature at an inlet of a stack and an air flow rate; active area obtained by measuring the stack of the tested fuel cell by the cyclic voltammetry is acquired; the hydrogen permeation current obtained by measuring the stack of the tested fuel cell by the linear sweep voltammetry is acquired; calculation is carried out based on the stack voltage, the active area and the hydrogen permeation current to obtain the mixed aging index; where the operation parameters and the mixed aging index form a set of measurement data.

The operation parameters and the stack voltage can be measured by sensors. In this embodiment, cyclic voltammetry measurement and linear sweep voltammetry measurement can be carried out on the stack based on the laboratory electrochemical workstation, respectively. Specifically, when the cyclic voltammetry measurement is carried out, humidified hydrogen is introduced into the anode side of the fuel cell, and humidified nitrogen is introduced into the cathode side of the fuel cell. Triangular wave voltage sweep is applied to the stack of the fuel cell by the electrochemical workstation, so that the active area can be calculated based on the workstation software. Similarly, when linear sweep voltammetry measurement is carried out, humidified hydrogen is introduced into the anode side of the fuel cell, and humidified nitrogen is introduced into the cathode side of the fuel cell. Linearly increasing voltage sweep is applied to the stack of the fuel cell, so that the hydrogen permeation current can be calculated based on the workstation software.

After the stack voltage, the active area and the hydrogen permeation current are measured, the mixed aging index can be calculated by Formula (1).

(1.3) it is determined whether the number of sets of the measurement data reaches a preset value; if not, continue iteration, the tested fuel cell is taken as the fuel cell in the next cycle, and return to the step of "carrying out a durability test on the stack of the fuel cell"; if so, terminate iteration, and all the measurement data is sorted according to the sequence of acquisition time to obtain a measurement data set.

The sequence of acquisition time is also the sequence of iterations for the acquisition of the measurement data. The measurement data acquired in the Nth iteration is ranked in the Nth item, and the measurement data set is obtained after sorting is completed.

(1.4) the measurement data set is processed by a sliding window method to obtain a training data set.

When the training data set is constructed, the operating condition of the fuel cell system is taken as an input and the mixed aging index is taken as an output, and the measurement data set is processed to complete the construction of the training data set. The operating condition of the fuel cell system indicates the operation parameters.

Figure 3:
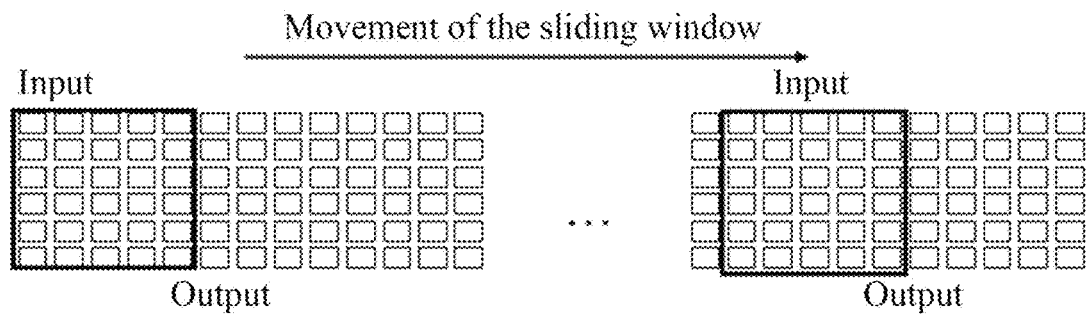
FIG. 3 is a schematic diagram of the construction of a training data set of a short-term attenuation prediction model based on a sliding window according to Embodiment 1 of the present disclosure.

As shown in FIG. 3, the measurement data set is a multi-parameter time series data in which each row corresponds to a parameter and each column corresponds to a moment. All parameters include the current I, the anode pressure $P_{an}$, the cathode pressure $P_{ca}$, the cooling liquid temperature T at the inlet of the stack, the air flow rate $W_{air}$ and the mixed aging index $\varphi$. The measurement data set is processed, including: moving the sliding window on the multi-parameter time series data, and cutting by the sliding window. All the data in the sliding window will form a two-dimensional input feature matrix, and then the two-dimensional input feature matrix (i.e. samples) can be obtained. Considering that a sliding window that is too wide will result in a large amount of calculation, and a sliding window that is too narrow will result in a small receptive field, the width of the sliding window can be set to about 5 on the premise that the specific duration is 1 hour. That is, the time series data with a length of 5 hours is taken as inputs (i.e., samples), and this embodiment can select the mixed aging index corresponding to the next moment of the sliding window as outputs (i.e., labels). The mixed aging index prediction model based on such training is a short-term attenuation prediction model. FIG. 3 is an example of a construction process of a training data set of a short-term attenuation prediction model. This embodiment can also select the corresponding mixed aging index after multiple moments of the sliding window as outputs. The mixed aging index prediction model based on such training is a long-term attenuation prediction model.

Prior to processing the measurement data set by the sliding window method, the fuel cell aging prediction method of this embodiment further includes normalizing all data in the measurement data set based on the Z-score method to obtain a normalized data set, and taking the normalized data set as a new measurement data set.

Through the acquisition process of the above measurement data set, the aging trend of the stack voltage, the aging trend of the active area and the aging trend of the hydrogen permeation current changing with time can be obtained in this embodiment. After the aging trends of the stack voltage, the active area and the hydrogen permeation current changing with time are acquired, the influence degree of the stack voltage, the active area and the hydrogen permeation current can be further determined by the mathematical statistics method, and then the weight factor of the voltage a, the weight factor of the active area b and the weight factor of the hydrogen permeation current c can be determined. As an example, the weight factor a of the voltage, the weight factor b of the active area and the weight factor c of the hydrogen permeation current in the mixed aging index can be determined by a factor analysis method or an information weight method, and then the aging trend of the mixed aging index of the fuel cell changing with time can be obtained by Formula (1).

Specifically, in this embodiment, stack voltage time series data, active area time series data and hydrogen permeation current time series data are analyzed by a factor analysis method or an information weight method to obtain a weight factor of the voltage, a weight factor of the active area and a weight factor of the hydrogen permeation current. The stack voltage time series data is the time series data obtained by sorting the stack voltages in the measurement data set according to the sequence of acquisition time, that is, the aging trend of the stack voltage changing with time. The active area time series data is the time series data obtained by sorting the active areas in the measurement data set according to the sequence of acquisition time, that is, the aging trend of the active area changing with time. The hydrogen permeation current time series data is the time series data obtained by sorting the hydrogen permeation currents in the measurement data set according to sequence of acquisition time, that is, the aging trend of the hydrogen permeation current changing with time.

(2) an initial prediction model is established, where the initial prediction model is a depth residual network based on a Spatial and Channel Squeeze & Excitation (scSE) attention mechanism.

After constructing the training data set, this embodiment can further construct an initial prediction model, which can be a typical machine learning model. In an embodiment, the initial prediction model can be a mixed aging index attenuation prediction model of a fuel cell based on deep learning, that is, the initial prediction model can be a typical deep learning model, such as convolutional neural networks and long short-term memory networks. The deep learning model is used to learn the nonlinear relationship between the two-dimensional input feature matrix and the mixed aging index, thereby constructing the offline mixed aging index attenuation prediction model of the stack. In another embodiment, the deep learning model selected in this embodiment is a scSE-based deep residual network (scSEResNet). The introduction of the scSE attention mechanism can increase the weight of effective features, and reduce the weight of ineffective features or features with little effects, so as to improve the model learning ability.

(3) the initial prediction model is trained by the training data set to obtain a mixed aging index prediction model.

After the mixed aging index attenuation prediction model of the fuel cell (that is, the mixed aging index prediction model) is obtained by training, during the shutdown of the fuel cell system, the active area and hydrogen permeation current measuring device is used to measure the stack of the fuel cell. The measured active area and hydrogen permeation current are integrated with the stack voltage recorded before the shutdown of the fuel cell system to obtain the mixed aging index at the current moment or the current stage, and then a two-dimensional input feature matrix is formed based on the mixed aging index at the current moment or the current stage together with the current, the anode pressure, the cathode pressure, the cooling liquid temperature at the inlet of the stack and the air flow rate recorded before the shutdown of the fuel cell system. The two-dimensional input feature matrix is input into the mixed aging index prediction model to update the weight of the model. Thus the mixed aging index prediction model can be more in line with the real situation of the fuel cell system. Thereafter, based on the updated model, the attenuation of the future short-term or long-term mixed aging index of the fuel cell system is predicted.

In the practical application of the fuel cell system, the attenuation trend of the mixed aging index of the future stack can be predicted based on the fuel cell aging prediction method of this embodiment. Once the mixed aging index is predicted to be lower than the limit value, an alarm will be made in time or the operating conditions of the fuel cell will be changed in advance, so as to prolong its service life and promote the commercialization process of fuel cell vehicles.

For fuel cell aging prediction, this embodiment combines the stack voltage, the active area and the hydrogen permeation current, determines the weight factor of each parameter by the mathematical statistics method, constructs a mixed aging index that can reflect the external characteristic attenuation and internal material attenuation of the fuel cell, and predicts the aging based on the depth residual network of the attention mechanism. Compared with service life attenuation prediction of the fuel cell based on a single aging index, this embodiment can provide more internal and external aging information, which is beneficial to the control and maintenance of the fuel cell system.

Embodiment 2

This embodiment provides a fuel cell aging prediction system, including: a sensor measuring device, an active area and hydrogen permeation current measuring device and a processor.

The sensor measuring device is configured to measure operation parameters and stack voltages of a fuel cell; where the operation parameters include a current, an anode pressure, a cathode pressure, a cooling liquid temperature at an inlet of a stack and an air flow rate. The sensor measuring device includes multiple sensors, and the operation parameters and the stack voltage are collected by multiple sensors.

The active area and hydrogen permeation current measuring device is configured to measure the active area and the hydrogen permeation current of the fuel cell.

The processor is in communication with the sensor measuring device and the active area and hydrogen permeation current measuring device, respectively. The processor is configured to execute the fuel cell aging prediction method described in Embodiment 1.

In order to establish the mixed aging index, it is necessary to be able to measure the active area and hydrogen permeation current online on the vehicle-mounted fuel cell system. Some technologies use empirical formulas to estimate the active area of the stack, which has a great error risk. Some technologies use a semi-empirical and semi-mechanical model to fit the polarization curve of the fuel cell, and then obtain the active area of the stack, but this method involves the measurement of the polarization curve, which is long in cycle length and high in hydrogen consumption. Although the hydrogen permeation current measurement methods proposed by some technologies are improved compared with the traditional measurement methods, they still cannot be applied in the vehicle-mounted environment, because nitrogen required for the measurement of the cathode side of the fuel cell cannot be provided in the vehicle-mounted environment. Therefore, it is necessary to establish a measuring device that can measure the active area and the hydrogen permeation current on the vehicle-mounted fuel cell system.

Figure 4:
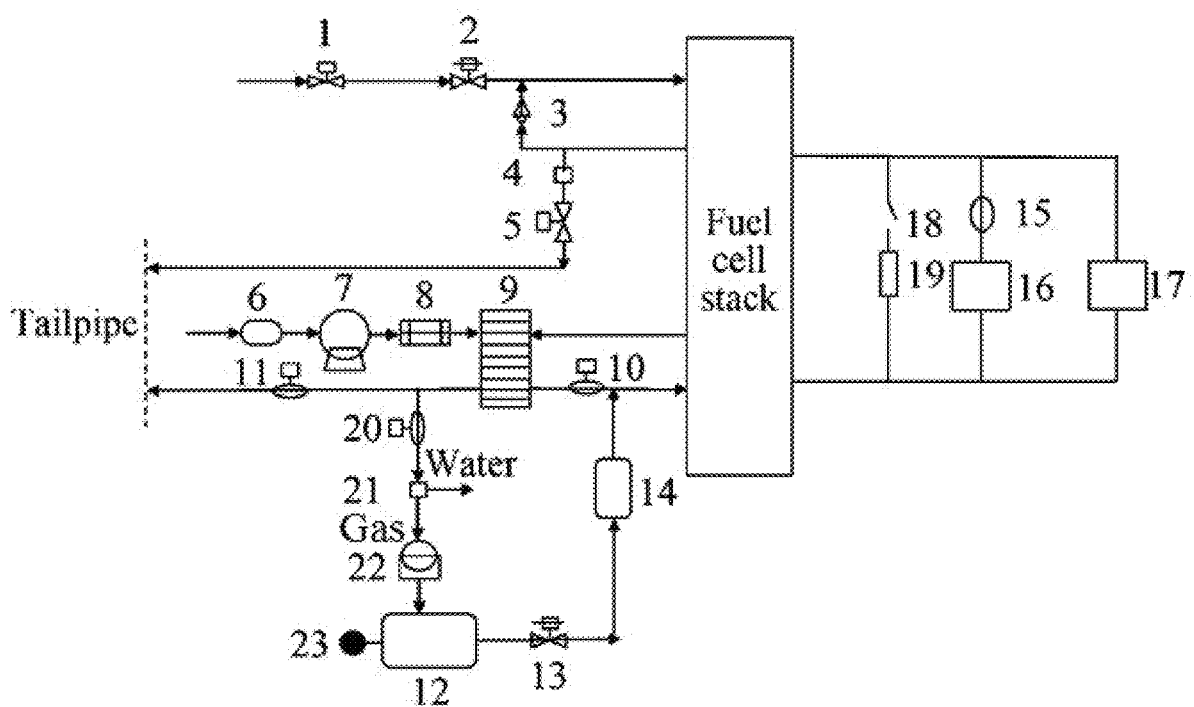
FIG. 4 is a schematic diagram of a fuel cell system which can measure active area and a hydrogen permeation current online according to Embodiment 2 of the present disclosure.

This embodiment provides an online electrochemical performance measuring device, that is, an active area and hydrogen permeation current measuring device. FIG. 4 illustrates a fuel cell system including the active area and hydrogen permeation current measuring device. In this case, the fuel cell system mainly includes a hydrogen subsystem, an air subsystem, a thermal management subsystem and an active area and hydrogen permeation current measuring device.

As shown in FIG. 4, the hydrogen subsystem includes a hydrogen inlet solenoid valve 1, a first proportional valve 2, a hydrogen circulation device 3 and a hydrogen discharging assembly. The hydrogen discharging assembly includes a first gas-water separator 4 and a hydrogen discharging valve 5. The hydrogen subsystem mainly provides the fuel cell with hydrogen required for the reaction. Specifically, hydrogen enters the anode inlet of the fuel cell through the hydrogen inlet solenoid valve 1 and the first proportional valve 2. A part of the unreacted hydrogen enters the anode of the fuel cell again through the hydrogen circulation device 3. The other part of the unreacted hydrogen passes through the first gas-water separator 4, and then the separated hydrogen is discharged to the tailpipe through the hydrogen discharging valve 5.

As shown in FIG. 4, the air subsystem includes a mass flowmeter 6, an air compressor 7, an intercooler 8, a humidifier 9, a front throttle 10 and a back pressure valve 11. The mass flowmeter 6 is configured to determine the mass flow rate of air passing through the mass flowmeter. The air compressor 7 is configured to compress gas. The intercooler 8 is configured to reduce the temperature of pressurized high-temperature air. The humidifier 9 is configured to increase the air humidity. The front throttle 10 is configured to control the gas supply. The back pressure valve 11 is configured to keep the air at a certain pressure in the pipeline, thereby preventing the air from flowing backwards and controlling the flow rate and the pressure of air. The air subsystem mainly provides the fuel cell with the air required for the reaction. Specifically, the air enters the cathode inlet of the fuel cell through the mass flowmeter 6, the air compressor 7, the intercooler 8, the humidifier 9 and the front throttle 10. The cathode outlet gas of the fuel cell enters the tailpipe through the humidifier 9 and the back pressure valve 11.

The active area and hydrogen permeation current measuring device of this embodiment can be used in a vehicle-mounted fuel cell system. The main purpose of the active area and hydrogen permeation current measuring device is to realize cyclic voltammetry measurement and linear sweep voltammetry measurement. As shown in FIG. 4, the active area and hydrogen permeation current measuring device includes a gas supply part, a charging part and a data acquisition and calculation unit 17.

The gas supply part is connected with a stack pipeline of the fuel cell. The gas supply part is configured to supply nitrogen to a cathode pipeline of the fuel cell. Specifically, the gas supply part includes a nitrogen storage tank 12, a second proportional valve 13 and a bubble humidifier 14. The bubble humidifier 14 is configured to adjust the humidity of nitrogen. Nitrogen in the nitrogen storage tank 12 enters the cathode pipeline of the fuel cell after passing through the second proportional valve 13 and the bubble humidifier 14.

The charging part is electrically connected with the stack of the fuel cell. The charging part is configured to charge the stack of the fuel cell. Specifically, the charging part includes a power converter 15 and a power battery 16. The combination of the power converter 15 and the power battery 16 can charge the stack.

The data acquisition and calculation unit 17 is connected with the gas supply part and the charging part in a control manner, respectively. The data acquisition and calculation unit 17 is configured to control the gas supply part to start working, i.e. providing nitrogen to the cathode pipeline of the fuel cell, control the charging process of the charging part to the stack of the fuel cell based on a cyclic voltammetry, acquire a first voltammetry characteristic curve in the charging process, calculate the active area based on the first voltammetry characteristic curve, control the charging process of the charging part to the stack of the fuel cell based on a linear sweep voltammetry, acquire a second voltammetry characteristic curve in the charging process, and calculate a hydrogen permeation current based on the second voltammetry characteristic curve. Specifically, a voltage sensor and a current sensor are built in the data acquisition and calculation unit 17, which can acquire the voltage and the current of the fuel cell during the charging process to form a first voltammetry characteristic curve or a second voltammetry characteristic curve. The voltammetry characteristic curve is a curve where the current changes with the change in voltage. Data analysis of cyclic voltammetry measurement and data analysis of linear sweep voltammetry measurement are carried out to obtain the active area and the hydrogen permeation current.

In this embodiment, the active area and hydrogen permeation current measuring device further includes: a discharging part and a suction part.

The discharging part is electrically connected with the stack of the fuel cell. The discharging part is configured to discharge the stack of the fuel cell to consume oxygen in the cathode pipeline of the fuel cell, so that only nitrogen exists in the cathode pipeline. Specifically, the discharging part includes a discharge relay 18 and a discharge resistor 19.

The suction part is connected with the cathode pipeline and the gas supply part pipeline, respectively. The suction part is configured to suck nitrogen in the cathode pipeline and then store the nitrogen in the gas supply part. Specifically, the suction part includes a bypass throttle 20, a second gas-water separator 21 and a blower 22. The blower 22 is connected with the nitrogen storage tank 12 in the gas storage part. The blower 22 operates eccentrically by the offset rotor, so that the air is sucked, compressed and ejected by changing the volume between the blades in the rotor groove.

The data acquisition and calculation unit 17 is connected with the discharging part and the suction part in a control manner, respectively. The data acquisition and calculation unit 17 is configured to control the discharging part and the suction part to start working.

The active area and hydrogen permeation current measuring device of this embodiment further includes a pressure sensor 23. The pressure sensor 23 is installed in the nitrogen storage tank 12 for detecting the pressure in the nitrogen storage tank 12.

For the active area and hydrogen permeation current measuring device, the inlet of the back pressure valve 11 is connected with the inlet of the bypass throttle 20. The outlet of the bypass throttle 20 is connected with the inlet of the second gas-water separator 21. The moisture outlet of the second gas-water separator 21 is connected with the inlet of the bubble humidifier 14. The dry gas outlet of second gas-water separator 21 is connected with the inlet of the blower 22. The outlet of the blower 22 is connected with the inlet of the nitrogen storage tank 12. The outlet of the nitrogen storage tank 12 is connected with the inlet of the second proportional valve 13. The outlet of the second proportional valve 13 is connected with the gas inlet of the bubble humidifier 14. The gas outlet of the bubble humidifier 14 is connected with the outlet of the front throttle 10. The discharge resistor 19 and the discharge relay 18 are connected with the output of the stack. The power battery 16 and the power convert 15 are connected with the output of the stack. The data acquisition and calculation unit 17 is connected with the output of the stack.

Figure 5:
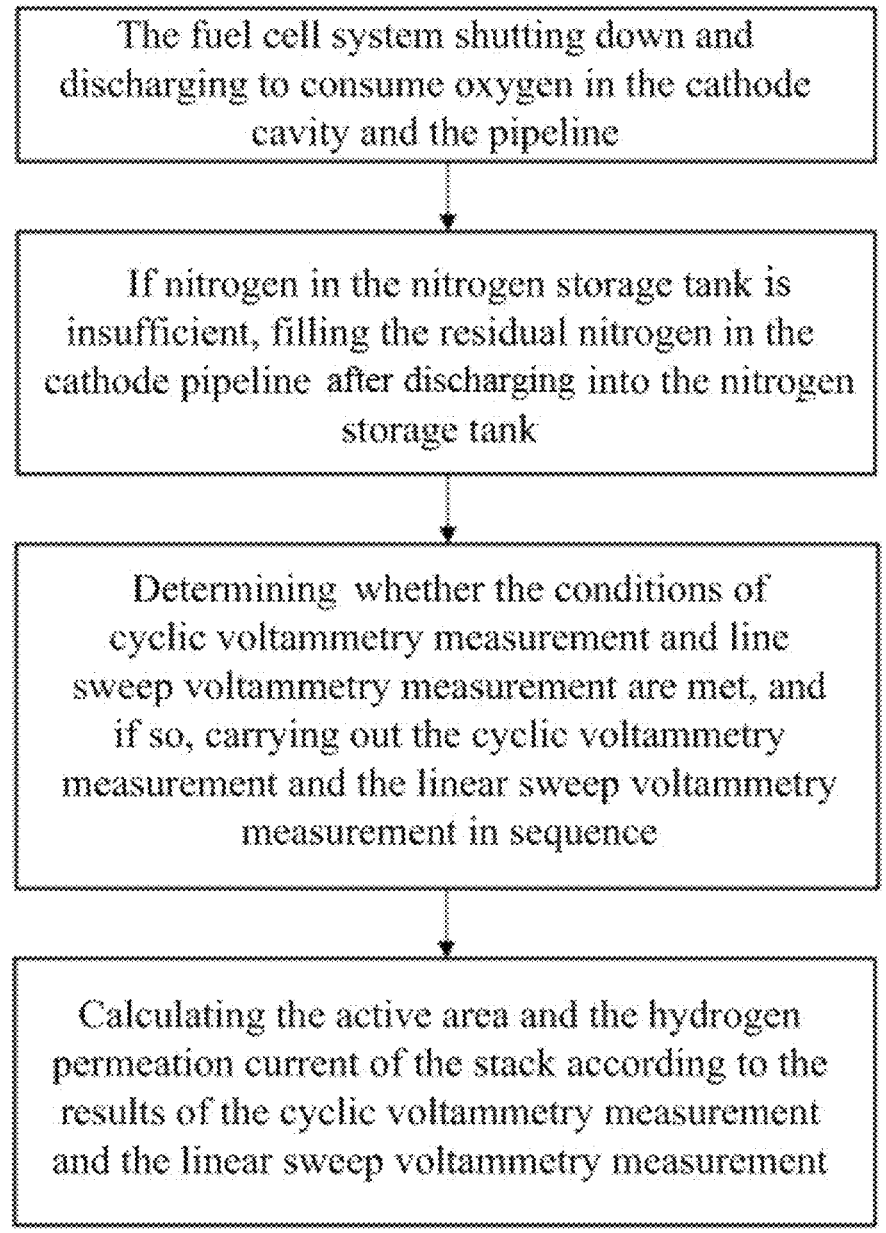
FIG. 5 is a schematic flowchart diagram of a calculation of active area and a hydrogen permeation current of a vehicle-mounted fuel cell system according to Embodiment 2 of the present disclosure.

As shown in FIG. 5, the main steps of measuring the active area and the hydrogen permeation current online by the active area and hydrogen permeation current measuring device of this embodiment are as follows.

During the shutdown of the fuel cell system, it is determined whether the pressure in the nitrogen storage tank 12 is lower than the limit value. When the pressure is lower than the limit value, it indicates that the nitrogen in the nitrogen storage tank 12 is insufficient and the nitrogen storage tank 12 needs to be replenished with nitrogen. The step of replenishing nitrogen is as follows. The front throttle 10 and the bypass throttle 20 are turned off, the discharge relay 18 is turned on, and the discharge operation is carried out through the discharge resistor 19, so that the residual oxygen in the cathode pipeline can be consumed, and then there is mainly high-concentration nitrogen in the cathode pipeline. The bypass throttle 20 is turned on, the second proportional valve 13 is turned off, and the blower 22 is turned on. The rotation speed of the blower 22 is properly adjusted, so that the residual nitrogen in the cathode pipeline after discharge can be pressed into the nitrogen storage tank 12. Once the pressure in the nitrogen storage tank 12 is detected to rise to the target value, the blower 22 is turned off. In addition, when the blower 22 is turned on, if the cathode pressure of the stack is a negative pressure that is too low or the pressure difference between the cathode and the anode exceeds the limit value, the blower 22 is also turned off.

It is determined whether that the conditions of cyclic voltammetry measurement and linear sweep voltammetry measurement are met. The specific conditions are as follows. The pressure in the nitrogen storage tank 12 is higher than a specific value (there is enough nitrogen), and the fuel cell system is still in a shutdown state at this time. When this condition is met, the cyclic voltammetry measurement and the linear sweep voltammetry measurement can be carried out to acquire the active area and the hydrogen permeation current. The specific steps of cyclic voltammetry measurement are as follows. The pressure of the anode inlet of the stack is adjusted to an appropriate value by adjusting the opening degree of the first proportional valve 2, the front throttle 10 and the back pressure valve 11 are turned off at the same time, and the second proportional valve 13 is adjusted in real time to ensure that the cathode cavity of the stack is filled with nitrogen during the measurement. The humidity of the bubble humidifier 14 can be adjusted to adjust the humidity of nitrogen entering the cathode of the stack. On this basis, a triangular wave voltage sweep is applied to the stack by means of the power battery 16 and the power converter 15, the current and voltage data are recorded to obtain a cyclic voltammetry curve (i.e. the first voltammetry characteristic curve), the hydrogen desorption peak area is determined according to the first voltammetry characteristic curve, and the electrochemical active area of the stack, which is denoted as $S_{ECA}$, is further calculated according to the obtained hydrogen desorption peak area and the cyclic voltammetry sweep rate. For the linear sweep voltammetry measurement, the process is similar to the cyclic voltammetry measurement. After adjusting the pressure of the anode inlet of the stack and the opening degree of the second proportional valve 13, the linearly increasing voltage sweep is applied to the stack, and the current and voltage data are recorded to obtain the second voltammetry characteristic curve. The steady-state value of the final response current in the second voltammetry characteristic curve is the hydrogen permeation current of the stack, which is denoted as $I_s$. It should be noted that the data acquisition and recording device can be matched with the fuel cell monomer voltage detection device, so that the active area and the hydrogen permeation current of each single chip in the stack can be detected.

In this embodiment, the blower 22, the nitrogen storage tank 12 and the second proportional valve 13 are innovatively configured in the air subsystem of the fuel cell. The residual nitrogen in the cathode cavity and the air pipeline can be collected and stored in the nitrogen storage tank 12 after the shutdown and discharge process of the fuel cell system. Based on this, the fuel cell can be subjected to the cyclic voltammetry measurement and the linear sweep voltammetry measurement in combination with the power battery 16 and the power converter 15 to acquire the active area and hydrogen permeation current parameters. At this point, the attenuation prediction model can be updated based on the active area and the hydrogen permeation current of the stack measured online in real time to improve its future attenuation prediction accuracy.

Embodiment 3

Provided is a non-transitory computer-readable storage medium having a computer program stored thereon, wherein the computer program, when executed by a processor, implements the steps of the fuel cell aging prediction method described in Embodiment 1.

Embodiment 4

Provided is a computer program product, including a computer program, where the computer program, when executed by a processor, implements the steps of the fuel cell aging prediction method described in Embodiment 1.

The technical features of the above embodiments can be combined at will. In order to make the description concise, not all possible combinations of the technical features in the above embodiments are described. However, as long as there is no contradiction between the combinations of these technical features, the combinations should be considered as the scope recorded in this description.

In the present disclosure, specific examples are applied to illustrate the principle and implementation of the present disclosure, and the illustrations of the above embodiments are only used to help understand the method and core ideas of the present disclosure. At the same time, according to the idea of the present disclosure, there will be some changes in the specific implementation and application scope for those skilled in the art. To sum up, the contents of the description should not be construed as limiting the present disclosure.

What is claimed is:

1. A fuel cell aging prediction method, comprising:
measuring, by a sensor measuring device, operation parameters and a stack voltage of calculation parameters of a fuel cell corresponding to each historical moment in a historical time period, wherein the operation parameters comprise a current, an anode pressure, a cathode pressure, a cooling liquid temperature at an inlet of a stack and an air flow rate; and the calculation parameters comprise the stack voltage, an active area and a hydrogen permeation current;
measuring, by an active area and hydrogen permeation current measuring device, the active area and the hydrogen permeation current of the stack corresponding to each historical moment in the historical time period;
for each historical moment in the historical time period, carrying out, by a processor, calculation based on the calculation parameters corresponding to the historical moment to obtain a mixed aging index corresponding to the historical moment;
inputting, by the processor, the operation parameters and the mixed aging index corresponding to each historical moment in the historical time period into a mixed aging index prediction model; and
predicting the mixed aging index corresponding to a prediction moment by the mixed aging index prediction model;
wherein:
a calculation expression of the mixed aging index is:

$$\phi = a\frac{V}{V_0} + b\frac{S_{ECA}}{S_{ECA0}} + c\frac{I_{S0}}{I_S};$$

where $\phi$ is the mixed aging index; a is a weight factor of the voltage; V is the stack voltage in unit of V; $V_0$ is a standard value of the stack voltage in unit of V; b is a weight factor of the active area; $S_{ECA}$ is the active area in unit of $m^2/g$; $S_{ECA0}$ is a standard value of the active area in unit of $m^2/g$; c is a weight factor of the hydrogen permeation current; $I_{S0}$ is a standard value of the hydrogen permeation current in unit of $mA/cm^2$; $I_s$ is the hydrogen permeation current in unit of $mA/cm^2$;

the active area and hydrogen permeation current measuring device comprises a gas supply part, a charging part and a data acquisition and calculation unit; wherein:
the gas supply part is configured to supply nitrogen to a cathode pipeline of the stack, and comprises a nitrogen storage tank, a second proportional valve and a bubble humidifier; an outlet of the nitrogen storage tank is connected with an inlet of the second proportional valve, an outlet of the second proportional valve is connected with a gas inlet of the bubble humidifier, a gas outlet of the bubble humidifier is connected with a stack pipeline of the fuel cell;
the charging part is configured to charge the stack of the fuel cell, and comprises a power converter and a power battery, the power converter and the power battery are connected with an output of the stack; and
the data acquisition and calculation unit with a built-in voltage sensor and a built-in current sensor is connected with the gas supply part and the charging part in a control manner, respectively; and
measuring, by the active area and hydrogen permeation current measuring device, the active area and the hydrogen permeation current of the stack corresponding to each historical moment in the historical time period comprises:
determining whether measurement conditions are met, the measurement conditions are that pressure in the nitrogen storage tank is higher than a preset value, and the fuel cell is in a shutdown state;
in response to that the measurement conditions are met, adjusting pressure of an anode inlet of the stack to a preset value by adjusting an opening degree of a first proportional valve of a hydrogen subsystem, wherein the hydrogen subsystem is configured to provide the stack with hydrogen required for reaction, and the first proportional valve is connected with the anode inlet of the stack;
turning off a front throttle and a back pressure valve of an air subsystem, and adjusting the second proportional valve in real time to ensure that a cathode cavity of the stack is filled with nitrogen during measurement, wherein the air subsystem is configured to provide the stack with air required for the reaction, the front throttle is connected with a cathode inlet of the stack, and the back pressure valve is connected with a cathode outlet of the stack;
adjusting the bubble humidifier to adjust humidity of the nitrogen entering the cathode pipeline of the stack;
applying a triangular wave voltage sweep to the stack by means of the power battery and the power converter, and recording first current and voltage data;
obtaining a first voltammetry characteristic curve based on the first current and voltage data;
determining a hydrogen desorption peak area based on the first voltammetry characteristic curve;
calculating an electrochemical active area of the stack based on the hydrogen desorption peak area and a cyclic voltammetry sweep rate;
applying a linearly increasing voltage sweep to the stack, and recording second current and voltage data; and obtaining a second voltammetry characteristic curve based on the second current and voltage data, wherein the hydrogen permeation current of the stack is a steady-state value of a final response current in the second voltammetry characteristic curve.

2. The fuel cell aging prediction method according to claim 1, wherein prior to inputting the operation parameters and the mixed aging index corresponding to each historical moment in the historical time period into a mixed aging index prediction model, the method further comprises:

acquiring a training data set; wherein the training data set comprises a plurality of samples and a label corresponding to each sample; the samples comprise operation parameters and the mixed aging index of the fuel cell corresponding to each sample historical moment in a sample historical time period; the label comprises a mixed aging index corresponding to a sample prediction moment;

establishing an initial prediction model; wherein the initial prediction model is a depth residual network based on a Spatial and Channel Squeeze & Excitation attention mechanism; and training the initial prediction model by the training data set to obtain a mixed aging index prediction model.

3. The fuel cell aging prediction method according to claim 2, wherein acquiring the training data set comprises:

carrying out a durability test on the stack of the fuel cell to obtain a tested fuel cell;

acquiring the operation parameters and the stack voltage obtained by measuring the tested fuel cell;

acquiring the active area obtained by measuring the stack of the tested fuel cell by a cyclic voltammetry;

acquiring the hydrogen permeation current obtained by measuring the stack of the tested fuel cell by a linear sweep voltammetry;

carrying out calculation based on the stack voltage, the active area and the hydrogen permeation current to obtain the mixed aging index, wherein the operation parameters and the mixed aging index form a set of measurement data;

determining whether a number of sets of the measurement data reaches a preset value;

in response to the number of sets of the measurement data not reaching the preset value, continuing iteration with taking the tested fuel cell as the fuel cell in the next cycle, and returning to a step of carrying out the durability test on the stack of the fuel cell;

in response to the number of sets of the measurement data reaching the preset value, ending iteration, and sorting all the measurement data according to a sequence of acquisition time to obtain a measurement data set; and processing the measurement data set by a sliding window method to obtain the training data set.

4. The fuel cell aging prediction method according to claim 3, wherein stack voltage time series data, active area time series data and hydrogen permeation current time series data are analyzed by a factor analysis method or an information weight method to obtain the weight factor of the voltage, the weight factor of the active area and the weight factor of the hydrogen permeation current; the stack voltage time series data is time series data obtained by sorting the stack voltages in the measurement data set according to the sequence of acquisition time; the active area time series data is time series data obtained by sorting the active areas in the measurement data set according to the sequence of acquisition time; the hydrogen permeation current time series data is time series data obtained by sorting the hydrogen permeation currents in the measurement data set according to sequence of acquisition time.

5. A fuel cell aging prediction system, comprising: a sensor measuring device, an active area and hydrogen permeation current measuring device and a processor; wherein:

the sensor measuring device is configured to measure operation parameters and a stack voltage of calculation parameters of a fuel cell corresponding to each historical moment in a historical time period; wherein the operation parameters comprise a current, an anode pressure, a cathode pressure, a cooling liquid temperature at an inlet of a stack and an air flow rate, and the calculation parameters comprise the stack voltage, an active area and a hydrogen permeation current;

the active area and hydrogen permeation current measuring device is configured to measure the active area and the hydrogen permeation current of the stack corresponding to each historical moment in the historical time period, the active area and hydrogen permeation current measuring device comprises a gas supply part, a charging part and a data acquisition and calculation unit; wherein:

the gas supply part is configured to supply nitrogen to a cathode pipeline of the stack, and comprises a nitrogen storage tank, a second proportional valve and a bubble humidifier; an outlet of the nitrogen storage tank is connected with an inlet of the second proportional valve, an outlet of the second proportional valve is connected with a gas inlet of the bubble humidifier, a gas outlet of the bubble humidifier is connected with a stack pipeline of the fuel cell;

the charging part is configured to charge the stack of the fuel cell, and comprises a power converter and a power battery, the power converter and the power battery are connected with an output of the stack;

the data acquisition and calculation unit with a built-in voltage sensor and a built-in current sensor is connected with the gas supply part and the charging part in a control manner, respectively; and operations of measuring the active area and the hydrogen permeation current of the fuel cell performed by the active area and hydrogen permeation current measuring device comprises:

determining whether measurement conditions are met, the measurement conditions are that pressure in the nitrogen storage tank is higher than a preset value, and the fuel cell is in a shutdown state;

in response to that the measurement conditions are met, adjusting pressure of an anode inlet of the stack to a preset value by adjusting an opening degree of a first proportional valve of a hydrogen subsystem, wherein the hydrogen subsystem is configured to provide the stack with hydrogen required for reaction, and the first proportional valve is connected with the anode inlet of the stack;

turning off a front throttle and a back pressure valve of an air subsystem, and adjusting the second proportional valve in real time to ensure that a cathode cavity of the stack is filled with nitrogen during measurement, wherein the air subsystem is configured to provide the stack with air required for the reaction, the front throttle is connected with a cathode inlet of the stack, and the back pressure valve is connected with a cathode outlet of the stack;

adjusting the bubble humidifier to adjust humidity of the nitrogen entering the cathode pipeline of the stack;

applying a triangular wave voltage sweep to the stack by means of the power battery and the power converter, and recording first current and voltage data;

obtaining a first voltammetry characteristic curve based on the first current and voltage data;

determining a hydrogen desorption peak area based on the first voltammetry characteristic curve;

calculating an electrochemical active area of the stack based on the hydrogen desorption peak area and a cyclic voltammetry sweep rate;

applying a linearly increasing voltage sweep to the stack, and recording second current and voltage data; and obtaining a second voltammetry characteristic curve based on the second current and voltage data, wherein the hydrogen permeation current of the stack is a steady-state value of a final response current in the second voltammetry characteristic curve; and the processor is in communication with the sensor measuring device and the active area and hydrogen permeation current measuring device, respectively; and the processor is configured to:

for each historical moment in the historical time period, carry out calculation based on the calculation parameters corresponding to the historical moment to obtain a mixed aging index corresponding to the historical moment;

input the operation parameters and the mixed aging index corresponding to each historical moment in the historical time period into a mixed aging index prediction model; and predict the mixed aging index corresponding to a prediction moment by means of the mixed aging index prediction model.

6. The fuel cell aging prediction system according to claim 5, wherein the active area and hydrogen permeation current measuring device comprises: a discharging part and a suction part; wherein:

the discharging part is electrically connected with the stack of the fuel cell and configured to discharge the stack of the fuel cell to consume oxygen in the cathode pipeline of the fuel cell, so that only nitrogen exists in the cathode pipeline;

the suction part is connected with the cathode pipeline and a gas supply part pipeline respectively, and configured to suck nitrogen in the cathode pipeline and store the nitrogen in the gas supply part; and the data acquisition and calculation unit is connected with the discharging part and the suction part in a control manner, respectively, and configured to control the discharging part and the suction part to start working.

7. The fuel cell aging prediction system according to claim 5, wherein prior to inputting the operation parameters and the mixed aging index corresponding to each historical moment in the historical time period into a mixed aging index prediction model, the processor is further configured to perform the following operations:

acquiring a training data set; wherein the training data set comprises a plurality of samples and a label corresponding to each sample; the samples comprise operation parameters and the mixed aging index of the fuel cell corresponding to each sample historical moment in a sample historical time period; the label comprises a mixed aging index corresponding to a sample prediction moment;

establishing an initial prediction model; wherein the initial prediction model is a depth residual network based on a Spatial and Channel Squeeze & Excitation attention mechanism; and training the initial prediction model by the training data set to obtain a mixed aging index prediction model.

8. The fuel cell aging prediction system according to claim 7, wherein the processor is configured to perform the following operations to acquire the training data set:

carrying out a durability test on the stack of the fuel cell to obtain a tested fuel cell;

acquiring the operation parameters and the stack voltage obtained by measuring the tested fuel cell;

acquiring the active area obtained by measuring the stack of the tested fuel cell by a cyclic voltammetry;

acquiring the hydrogen permeation current obtained by measuring the stack of the tested fuel cell by a linear sweep voltammetry;

carrying out calculation based on the stack voltage, the active area and the hydrogen permeation current to obtain the mixed aging index, wherein the operation parameters and the mixed aging index form a set of measurement data;

determining whether a number of sets of the measurement data reaches a preset value;

in response to the number of sets of the measurement data not reaching the preset value, continuing iteration with taking the tested fuel cell as the fuel cell in the next cycle, and returning to a step of carrying out the durability test on the stack of the fuel cell;

in response to the number of sets of the measurement data reaching the preset value, ending iteration, and sorting all the measurement data according to a sequence of acquisition time to obtain a measurement data set; and processing the measurement data set by a sliding window method to obtain the training data set.

9. The fuel cell aging prediction system according to claim 8, wherein stack voltage time series data, active area time series data and hydrogen permeation current time series data are analyzed by a factor analysis method or an information weight method to obtain the weight factor of the voltage, the weight factor of the active area and the weight factor of the hydrogen permeation current; the stack voltage time series data is time series data obtained by sorting the stack voltages in the measurement data set according to the sequence of acquisition time; the active area time series data is time series data obtained by sorting the active areas in the measurement data set according to the sequence of acquisition time; the hydrogen permeation current time series data is time series data obtained by sorting the hydrogen permeation currents in the measurement data set according to sequence of acquisition time.

* * * * *